(12) United States Patent
Yon et al.

(10) Patent No.: US 8,917,544 B2
(45) Date of Patent: Dec. 23, 2014

(54) PHASE CHANGE MEMORY DEVICE, OPERATION METHOD THEREOF, AND DATA STORAGE DEVICE HAVING THE SAME

(75) Inventors: Sun Hyuck Yon, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 129 days.

(21) Appl. No.: 13/591,435

(22) Filed: Aug. 22, 2012

(65) Prior Publication Data
US 2013/0155765 A1  Jun. 20, 2013

(30) Foreign Application Priority Data

Dec. 15, 2011 (KR) ......................... 10-2011-0135693

(51) Int. Cl.
*G11C 11/21* (2006.01)

(52) U.S. Cl.
USPC ........... 365/163; 365/148; 365/149; 365/191; 365/207

(58) Field of Classification Search
USPC ............ 365/163, 148, 189.16, 190, 191, 207, 365/233, 194, 149, 189.01, 225.7
See application file for complete search history.

(56) References Cited

U.S. PATENT DOCUMENTS 8,559,207 B2 * 10/2013 Kim et al. ..................... 365/148

* cited by examiner

*Primary Examiner* — Richard Elms
*Assistant Examiner* — Mohammed A Bashar
(74) *Attorney, Agent, or Firm* — William Park & Associates Patent Ltd.

(57) ABSTRACT

A phase change memory device includes: a memory cell arranged at a region where a word line and a bit line cross each other; and a control logic including: a program control logic configured to control a program operation of the memory cell; a read control logic configured to control a read operation of the memory cell; and an operation complete signal transfer unit configured to adjust a transfer time point of an operation complete signal transferred between the program control logic and the read control logic.

20 Claims, 12 Drawing Sheets

PHASE CHANGE MEMORY DEVICE, OPERATION METHOD THEREOF, AND DATA STORAGE DEVICE HAVING THE SAME

CROSS-REFERENCES TO RELATED APPLICATION

The present application claims priority under 35 U.S.C. §119(a) to Korean application number 10-2011-0135693, filed on Dec. 15, 2011, in the Korean Intellectual Property Office, which is incorporated herein by reference in its entirety as if set forth in full.

BACKGROUND

1. Technical Field

The present invention relates to nonvolatile memory devices, and more particularly, to phase change memory devices.

2. Related Art

In general, semiconductor memory devices are classified into volatile memory devices and nonvolatile memory devices. The volatile memory devices lose data stored therein when the power supply is cut off. The nonvolatile memory devices maintain data stored therein even though power supply is cut off. Nonvolatile memory devices may include various types of the memory cells.

Nonvolatile memory devices include flash memory devices, ferroelectric RAM (FRAM), which use ferroelectric capacitors, magnetic RAM (MRAM) which may use a tunneling magneto-resistive (TMR) layer, and phase change memory devices, which may use chalcogenide alloys and the like, depending on the structure of memory cells. In particular, phase change memory devices are nonvolatile memory devices that use phase change, based on temperature change, that is, resistance change. For this reason, phase change memory devices are also referred to as a variable-resistance memory devices.

The memory cells of a phase change memory device are formed of a phase change material, for example, a chalcogenide alloy, which is typically a Ge—Sb—Te alloy (hereafter, referred to as 'GST material'). The GST material has an amorphous state exhibiting a relatively high resistivity and a crystalline state exhibiting a relatively low resistivity. The memory cell of the phase change memory device may store "1" data corresponding to the amorphous state and "0" data corresponding to the crystalline state. By controlling heat applied to the GST material, data corresponding to the amorphous state or the crystalline state is programmed into the memory cell of the phase change memory device. For example, both the magnitude and duration of a current for heating the GST material may be adjusted to control the amorphous state or crystalline state of the GST material.

The program operation of the phase change memory device includes a program operation for applying a program current to a selected memory cell and a verify read operation for verifying the state of the memory cell. Before the program current is applied to the selected memory cell, a selected word line should be maintained at a ground voltage level. Furthermore, before the state of the memory cell to which the program current is applied is verified, the selected word line should be maintained at the ground voltage level. When the selected word line is not maintained at the ground voltage level, the program current may not be normally passed, or a cell current for sensing data may not be normally passed.

The program operation will be described with reference to FIG. 1, which is a diagram that schematically illustrates a program operation of a conventional phase change memory device. Specifically, FIG. 1 illustrates the relationship between a cell current, Icell, that is passed through a selected memory cell, and a voltage Vwl of a selected word line when the cell current Icell is passed.

During the program operation of the phase change memory device, a program operation for applying a program current to a memory cell and a verify read operation for verifying the state of the memory cell may be repeated until the selected memory cell is programmed. When the cell current passed through the selected memory cell is not sufficiently discharged to the selected word line during the program operation and the verify read operation, the selected word line has a predetermined voltage level. That is, when an interval between the program operation and the verify read operation is so small as in periods A, B, C, or D of FIG. 1 such that the next operation is performed in a state where the selected word line is not sufficiently discharged, the selected word line has a predetermined voltage level instead of the ground voltage level.

When the selected word line has a predetermined voltage level instead of the ground voltage level, the program current is not sufficiently passed, and the selected memory cell may not be programmed to a desired state. Furthermore, when the selected word line has a predetermined voltage instead of the ground voltage level, a sensing current is not sufficiently passed, and the state of the selected memory cell may not be normally sensed. That is, when the cell current passed through the selected memory cell is not sufficiently discharged to the selected word line, an operation error may occur in the phase change memory device.

SUMMARY

According to aspects of the invention, there is provided a phase change memory device capable of reducing an error of a program operation, an operation method thereof, and a data storage device having the same, as further described herein.

In one aspect of the present invention, a phase change memory device includes: a memory cell arranged at a region where a word line and a bit line cross each other; and a control logic including: a program control logic configured to control a program operation of the memory cell; a read control logic configured to control a read operation of the memory cell; and an operation complete signal transfer unit configured to adjust a transfer time point of an operation complete signal transferred between the program control logic and the read control logic.

In another aspect of the present invention, an operation method of a phase change memory device includes the steps of: applying a program current to a selected memory cell; delaying transfer of a program complete signal indicating that the step of applying the program current was performed; and verifying a program state of the selected memory cell in response to the delayed program complete signal.

In another aspect of the present invention, a data storage device includes: a phase change memory device; and a controller configured to the control the phase change memory device. The phase change memory device includes: a memory cell arranged at a region where a word line and a bit line cross each other; and a control logic including: a program control logic configured to control a program operation of the memory cell; a read control logic configured to control a read operation of the memory cell; and an operation complete signal transfer unit configured to adjust a transfer time point of an operation complete signal transferred between the program control logic and the read control logic.

BRIEF DESCRIPTION OF THE DRAWINGS

The accompanying drawings, which are incorporated in and constitute part of this specification, illustrate various features, aspects, and embodiments consistent with the invention and, together with the description, serve to explain the principles of the invention.

DETAILED DESCRIPTION

Hereinafter, a phase change memory device, an operation method thereof, and a data storage device having the same according to aspects of the present invention will be described below with reference to the accompanying drawings, through exemplary embodiments. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form unless otherwise specified. Furthermore, 'include/comprise' or 'including/comprising' used in the specification represents that one or more components, steps, operations, and elements exists or are added.

Figure 1:
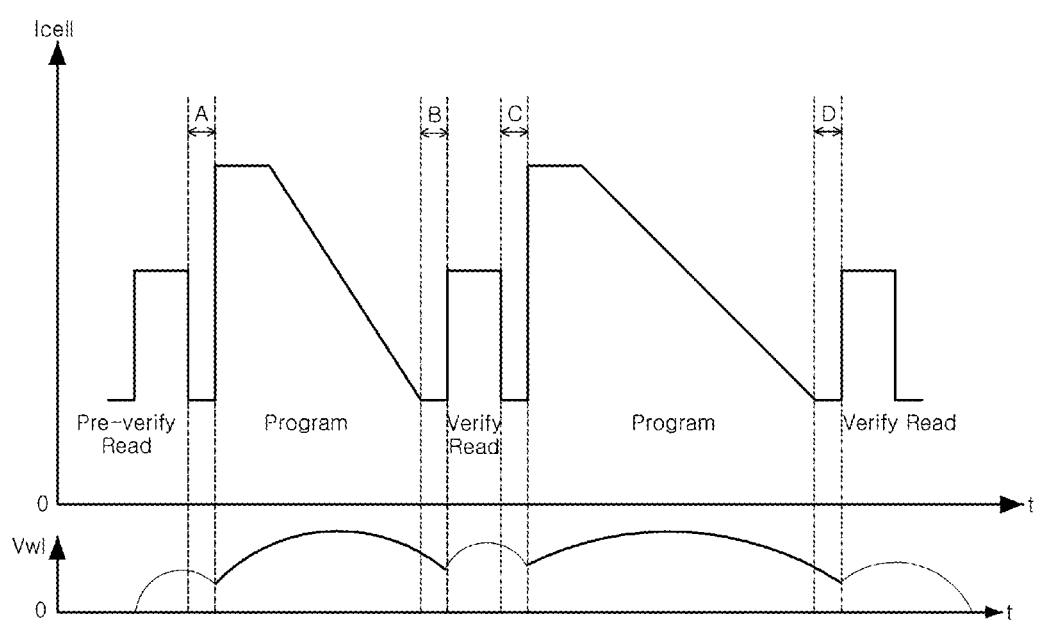
FIG. 1 is a diagram schematically illustrating a program operation of a conventional phase change memory device.
Figure 2:
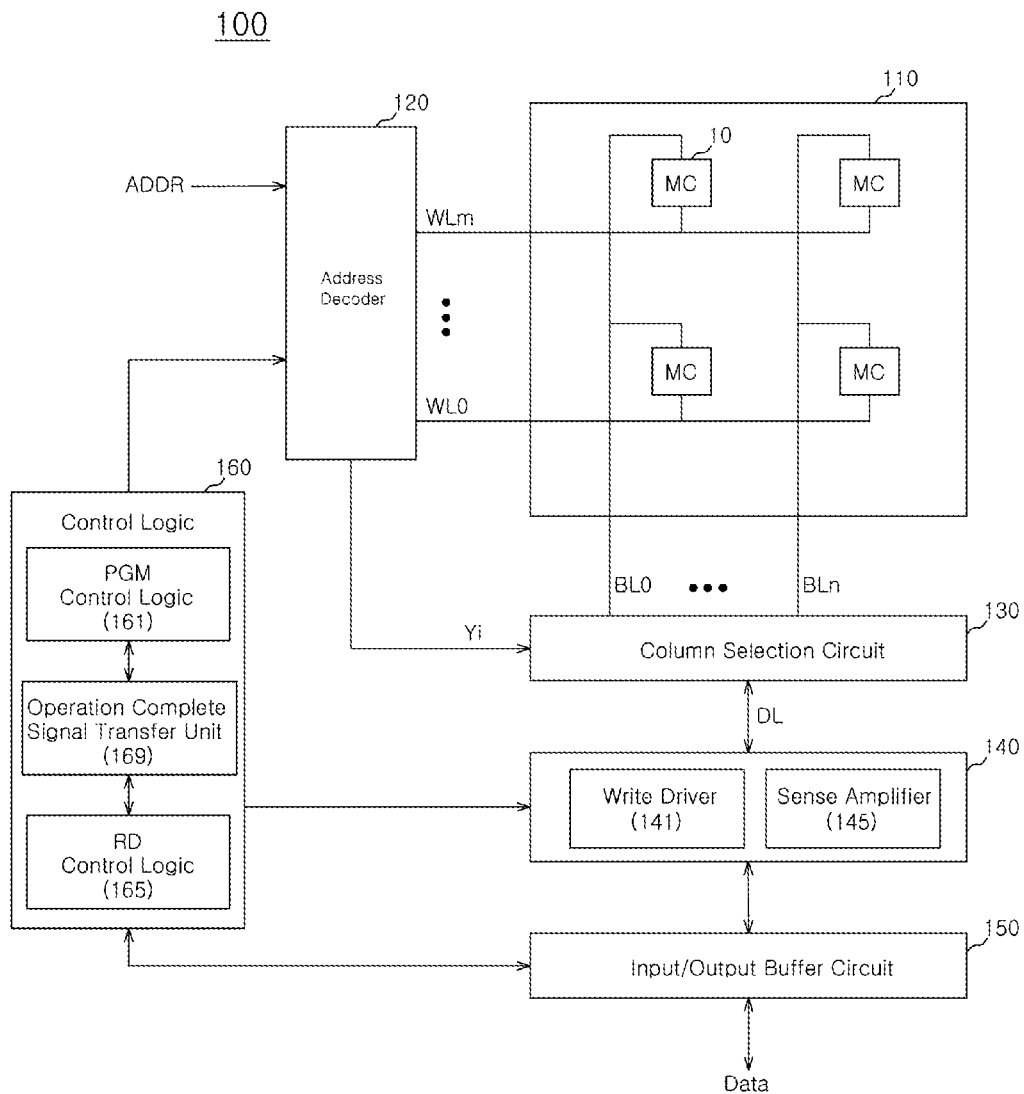
FIG. 2 is a block diagram of a phase change memory device according to one embodiment of the present invention.

FIG. 2 is a block diagram of a phase change memory device according to one embodiment of the present invention. Referring to FIG. 2, the phase change memory device 100 includes a memory cell array 110, an address decoder 120, a column selection circuit 130, a data read/write circuit 140, an input/output buffer circuit 150, and a control logic 160.

The memory cell array 110 includes a plurality of memory cells MC arranged at the respective intersections between bit lines BL0 to BLn and word lines WL0 to WLm. Each of the memory cell MC includes a phase change memory cell. For example, the memory cell MC may include a phase change memory cell having a memory element and a selecting element.

The memory cell MC has different resistance values depending on the program state of a phase change material (GST material) forming the memory element. The program state is divided into an amorphous state exhibiting a relatively high resistivity and a crystalline state exhibiting a relatively low resistivity. The amorphous state is defined as a reset state, and the crystalline state is defined as a set state. When the memory cell MC has the amorphous state, it means that data '1' is programmed, and when the memory cell MC has the crystalline state, it means that data '0' is programmed. The memory cell MC will be described in detail with reference to FIGS. 3 and 4.

In addition, the memory cell MC may have a plurality of intermediate states between the amorphous state and the crystalline state. The memory cell MC is referred to as a multi-level cell (MLC). The MLC may store two or more-bit data.

The address decoder 120 operates according to the control of the control logic 160. The address decoder 120 is coupled to the memory cell array 110 through the word lines WL0 to WLm. The address decoder 120 is configured to decode an address ADDR input from outside. The address decoder 120 provides a bias voltage to a selected word line according to the decoding result. The address decoder 120 generates a column select signal Yi for selecting a bit line according to the decoding result. The generated column select signal Yi is provided to the column selection circuit 130.

The column selection circuit 130 is coupled to the memory cell array 110 through the bit lines BL0 to BLn. The column selection circuit 130 is configured to select a bit line in response to the column select signal Yi (i=0~n) provided from the address decoder 120. The column selection circuit 130 is configured to electrically couple the selected bit line and a data line DL in response to the column select signal Yi.

The data read/write circuit 140 operates according to the control of the control logic 160. The data read/write circuit 140 includes a write driver 141 and a sense amplifier 145.

The write driver 141 is configured to provide a program current to the bit line BL through the data line DL in response to a write driver control signal (for example, a program pulse control signal). The write driver control signal is provided from a program control logic 161. The write driver 141 provides a reset current in response to a reset control signal, and provides a set current in response to a set control signal. The reset current is a current for changing a GST material of a selected memory cell into the reset state. That is, the reset current is a current for programming data '1' to the selected memory cell. The set current is a current for changing a GST material of a selected memory cell into the set state. That is, the set current is a current for programming data '0' to the selected memory cell.

The sense amplifier 145 is configured to read the data stored in the selected memory cell in response to a sense amplifier control signal during a read operation or verify read operation. The sense amplifier control signal is provided from the read control logic 165. The sense amplifier 145 senses a difference between the data line DL and a reference voltage, and performs a read operation.

The input/output buffer circuit 150 is configured to receive data from an external device (for example, a memory controller, a memory interface, a host or the like) or output data to the external device.

The control logic 160 is configured to control overall operations of the phase change memory device 100 in response to a command provided form the external device. For example, the control logic 160 may control the read, program (or write), and erase operations of the phase change memory device 100. Here, the erase operation indicates an operation of programming a memory cell such that the memory cell has the amorphous state. For this operation, the control logic 160 includes a program control logic 161 and a read control logic 165.

The program control logic 161 is configured to control a program operation into the reset state. That is, the program control logic 161 is configured to control an erase operation. Furthermore, the program control logic 161 is configured to control a program operation into the set state. The read control logic 165 is configured to control a read operation and a verify read operation. Here, the verify read operation is a read operation which is performed during a program operation, and is an operation for verifying whether or not a selected memory cell was programmed to a desired threshold voltage. The verify read operation may be performed in the same manner as the read operation, except that the read data is not output to the outside.

The control logic 160 includes an operation complete signal transfer unit 169. The operation complete signal transfer unit 169 is configured to adjust a transfer time point of an operation complete signal which is transferred between the program control logic 161 and the read control logic 165. For example, the operation complete signal transfer unit 169 may delay and transfer the operation complete signal transferred to the read control logic 165 from the program control logic 161, or transfer the operation complete signal without delay. As another example, the operation complete signal transfer unit 169 may delay and transfer the operation complete signal transferred to the program control logic 161 from the read control logic 165, or transfer the operation complete signal without delay. The operation complete signal transfer unit 169 adjusts the transfer time point of the operation complete signal such that the next operation is performed after the voltage level of the selected word line is stabilized. As the voltage level of the selected word line is stabilized, the phase change memory device 100 may also operate with stability.

Figure 3:
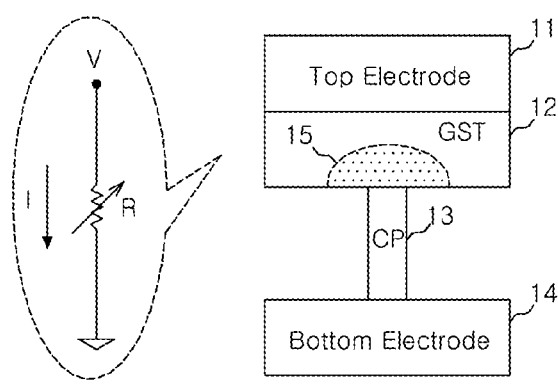
FIG. 3 is a diagram illustrating a memory element of a memory cell of FIG. 2.

FIG. 3 is a diagram explaining the memory element of the memory cell MC of FIG. 2. The memory cell of the phase change memory device 100 of FIG. 2 includes the memory element and the selecting element. FIG. 3 simply illustrates the memory element of the memory cell.

The memory element 16 has a variable resistance value according to an applied current I. Therefore, the memory element 16 is also referred to as a resistance element. Referring to FIG. 3 illustrating the cross-sectional structure of the memory element 16, the memory element 16 includes a top electrode 11, a GST material 12, a contact plug (CP) 13, and a bottom electrode 14.

The top electrode 11 is coupled to a bit line BL. The bottom electrode 14 is coupled between the contact plug (CP) 13 and a selecting element (not illustrated). The contact plug (CP) 13 is formed of a conductive material (for example, TiN or the like). The contact plug 13 is referred to as a heater plug. The GST material 12 is formed between the top electrode 11 and the contact plug (CP) 13.

The phase of the GST material 12 is changed according to the magnitude of a supplied current or a time during which the current is supplied. The phase of the GST material 12 corresponding to the reset state or the set state is determined by an amorphous volume 15 as illustrated in FIG. 3. As the phase progresses from the amorphous state to the crystalline state, the amorphous volume 15 decreases. The amorphous state corresponds to the reset state, and the crystalline state corresponds to the set state. The GST material 12 has a variable resistance value depending on the amorphous volume 15. That is, data to be written is determined by the amorphous volume 15 of the GST material 12, which is formed according to an applied current.

Figure 4:
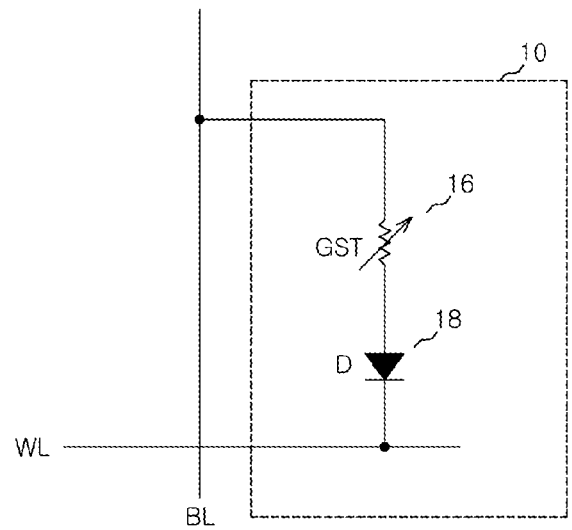
FIG. 4 is a circuit diagram illustrating the memory cell of FIG. 2.

FIG. 4 is a circuit diagram illustrating the memory cell of FIG. 2. FIG. 4 illustrates a phase change memory cell including a diode switch-type selecting element.

Referring to FIG. 4, the memory cell 10 includes a memory element 16 and a selecting element 18. The memory element 16 is coupled between a bit line BL and the selecting element 18. The selecting element 18 is coupled between the memory element 16 and a word line WL.

The memory element 16 has the same configuration as the memory element described in FIG. 3 and performs the same operation.

The selecting element 18 includes a diode D. The anode of the diode D is coupled to the memory element 16, and the cathode of the diode D is coupled to the word line WL. When a ground voltage GND is applied to the word line WL to select the memory cell 10, a voltage difference between the anode and the cathode of the diode D is changed. When the voltage difference between the anode and the cathode of the diode D becomes higher than the threshold voltage of the diode D, the diode D is turned on. When the diode D is turned on, the memory element 16 receives a current through the bit line BL.

The received current is passed to the word line WL through the memory element 16, that is, the memory cell. For example, during a read operation, a sensing current supplied to the memory cell through the bit line BL is passed to the word line WL according to the program state of the memory cell. At this time, the word line WL may have a higher voltage level than the ground voltage GND, because of a parasitic resistance component of the word line WL. As another example, during a program operation, a program current supplied to the memory cell through the bit line BL changes the state of the memory cell, and then flows into the word line WL. At this time, the word line WL may have a higher voltage level than the ground voltage GND, because of the parasitic resistance component of the word line WL.

Figure 5:
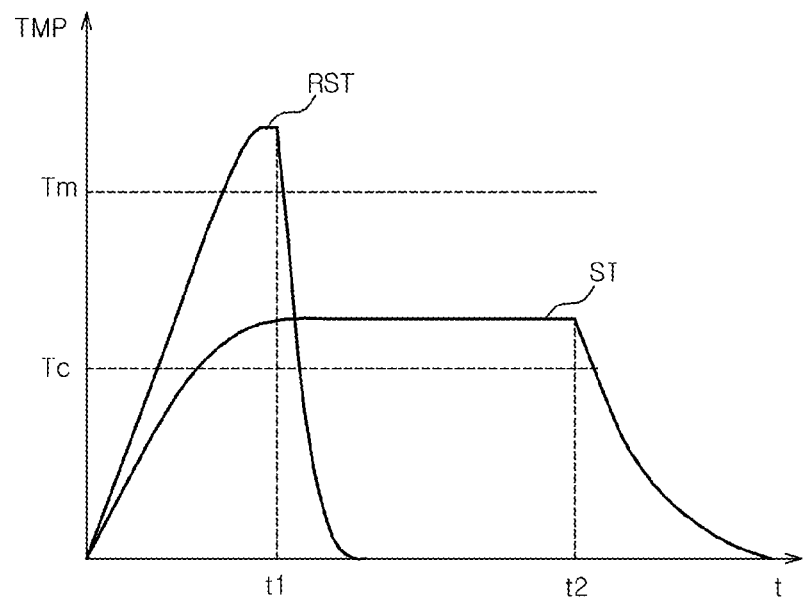
FIG. 5 is a graph illustrating characteristics of a phase change material illustrated in FIG. 4.

FIG. 5 is a graph illustrating characteristics of the phase change material shown in FIG. 4. In FIG. 5, symbol 'RST' indicates a condition where the GST material is changed to the amorphous state, i.e., the reset state, and symbol 'ST' indicates a condition where the GST material is changed to the crystalline state, i.e., the set state.

When the GST material is rapidly quenched after being heated at a higher temperature than a melting temperature Tm for a time t1, the GST material is changed into the amorphous state. When the GST material is changed into the amorphous state, the memory cell 10 stores data '1'. On the other hand, when the phase change material GST is slowly quenched after being heated at a higher temperature than a crystallization temperature Tc for a time t2 longer than the time t1, the GST material is changed into the crystalline state. Here, the crystallization temperature Tc is lower than the melting temperature Tm. When the GST material is changed into the crystalline state, the memory cell 10 stores data '0'.

Figure 6:
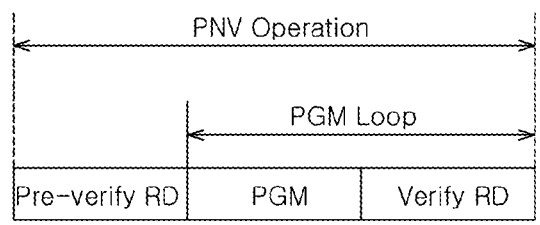
FIG. 6 is a conceptual diagram illustrating a program and verify operation (PNV operation) of the phase change memory device according to an embodiment of the present invention.

FIG. 6 is a conceptual diagram illustrating a program and verify operation (PNV operation) of the phase change memory device according to an embodiment of the present invention.

The PNV operation of the phase change memory device includes a program operation and a verify read operation. The program operation is an operation for applying a program current to a selected memory cell. Furthermore, the verify read operation is an operation for verifying the program state of the selected memory cell. That is, whether or not the selected memory cell was programmed to a desired threshold voltage is verified through the verify read operation.

The verify read operation includes a pre-verify read operation for verifying the program state of the selected memory cell before the program operation is performed. Furthermore, the verify read operation includes a verify read operation for verifying the program state of the selected memory cell after the program operation is performed. The verify read operation may be performed in the same manner as the read operation, except that the read data is not outputted to the outside.

In addition, the program operation and the verify read operation may form one program loop. The program loop is repetitively performed within a preset number, until the selected memory cell is programmed. Whenever the program loop is repeated, the same program current as a program current applied in a previous program loop or an increased program current may be applied to the selected memory cell.

According to an embodiment of the present invention, when the PNV operation is performed, the operation time points of the operations (for example, a program operation and a verify read operation) may be controlled to stabilize the voltage level of the selected word line. For example, the program operation may be delayed until the voltage level of the selected word line is stabilized after the pre-verify read operation is performed. As another example, the verify read operation may be delayed until the voltage level of the selected word line is stabilized after the program operation is performed. Such a delay operation is performed by the operation complete signal transfer unit 169 of FIG. 2. Hereafter, the operation complete signal transfer unit 169 will be described in detail with reference to FIGS. 7 and 8.

Figure 7:
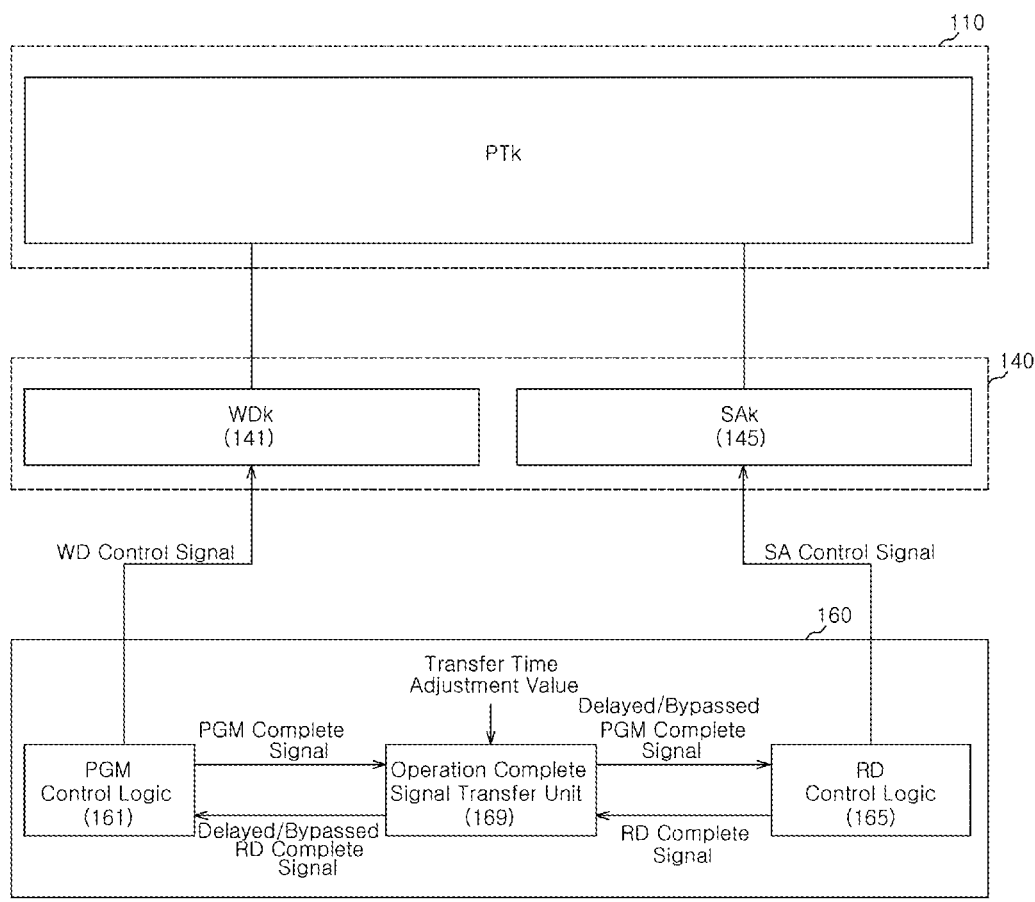
FIG. 7 is a block diagram explaining a control logic of the phase change memory device according to an embodiment of the present invention.

FIG. 7 is a block diagram explaining the control logic of the phase change memory device according to an embodiment of the present invention.

The memory cell array 110 includes a plurality of partitions. For clarity, FIG. 7 illustrates only one partition PTk. The partition PTk indicates a group of memory blocks. That is, the partition PTk includes a plurality of memory blocks. As is well-known, each of the memory blocks includes a plurality of memory cells.

A write driver WDk corresponding to the partition PTk performs a write operation on memory cells included in the partition PTk. The write driver WDk performs a program operation according to a write driver control signal provided from the program control logic 161. Furthermore, a sense amplifier SAk corresponding to the partition PTk performs a read operation and a verify read operation on memory cells included in the partition PTk. The sense amplifier SAk performs a read operation and a verify read operation according to a sense amplifier control signal provided from the read control logic 165.

The control logic 160 includes the program control logic 161, the read control logic 165, and the operation complete signal transfer unit 169. During the PNV operation as described above, the program control logic 161 and the read control logic 165 may alternately perform their operations. In this case, the program control logic 161 provides a program complete signal, which indicates that a program operation was completed, to the read control logic 165. The read control logic 165 performs a verify read operation when the program complete signal is received. Similarly, the read control logic 165 provides a read complete signal, which indicates that a read operation was completed, to the program control logic 161. The program control logic 161 performs a program operation when the read complete signal is received.

The operation complete signal transfer unit 169 is configured to adjust the transfer time points of the program complete signal and the read complete signal, which are transmitted between the program control logic 161 and the read control logic 165. For example, the operation complete signal transfer unit 169 may delay and transfer the program complete signal and the read complete signal, or transfer the program complete signal and the read complete signal without delay. When the operation complete signal transfer unit 169 delays and transfers the program complete signal and the read complete signal, the delay time may be increased or decreased according to a transfer time control value.

For example, the operation complete signal transfer unit 169 may delay the program complete signal transferred from the program control logic 161 according to the transfer time control value, and then transfer the delayed program complete signal to the read control logic 165. Alternatively, the operation complete signal transfer unit 169 may bypass the program complete signal transferred from the program control logic 161 according to the transfer time control value, and then transfer the bypassed program complete signal to the read control logic 165.

As another example, the operation complete signal transfer unit 169 may delay the read complete signal transferred from the read control logic 165 according to the transfer time control value, and then transfer the delayed read complete signal to the program control logic 161. Alternatively, the operation complete signal transfer unit 169 may bypass the read complete signal transferred from the read control logic 165 according to the transfer time control value, and then transfer the bypassed read complete signal to the program control logic 161.

The operation complete signal transfer unit 169 adjusts the transfer time points of the program complete signal and the read complete signal such that the next operation is performed after the voltage level of the selected word line is stabilized. Here, the next operation indicates a program operation performed after a pre-verify read operation, a verify read operation performed after a program operation, or a program operation performed after a verify read operation.

In addition, the transfer time control value provided to the operation complete signal transfer unit 169 may include a value obtained by experimentally measuring a time required until the voltage level of a selected word line is stabilized after an arbitrary operation is performed.

Figure 8:
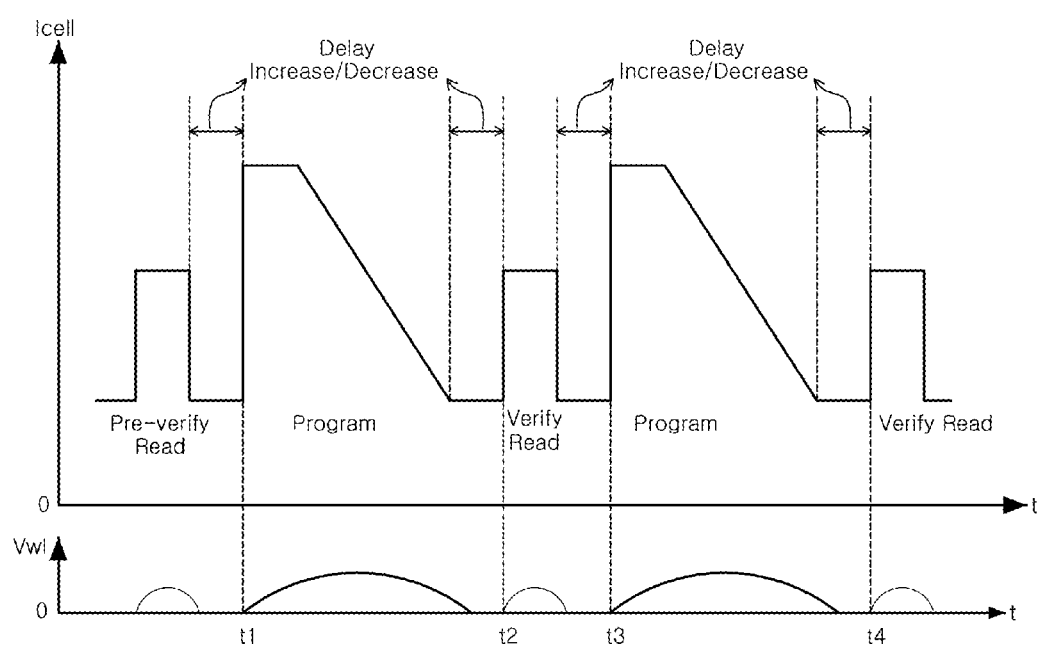
FIG. 8 is a diagram schematically illustrating a program operation of the phase change memory device according to an embodiment of the present invention.

FIG. 8 is a diagram schematically illustrating the program operation of the phase change memory device according to an embodiment of the present invention. In FIG. 8, it is assumed that a PNV operation is completed after a pre-verify read operation and two program loops are performed. According to an embodiment of the present invention, the next operation is performed by the operation complete signal transfer unit, after the voltage level of a selected word line is stabilized. More specifically, the program operation will be described as follows.

When a read complete signal is delayed and transferred by the operation complete signal transfer unit 169 after the pre-verify read operation is performed, a program operation is performed at a time point t1. The selected word line is stabilized until the program operation is started after the pre-verify read operation is completed. Here, the stabilization corresponds to a state in which a sensing current passed through a selected memory cell is sufficiently discharged to the selected word line such that a desired bias may be applied to the selected word line, during the pre-verify read operation. Therefore, when the program operation is performed, a ground voltage may be applied to the selected word line.

When a program complete signal is delayed and transferred by the operation complete signal transfer unit 169 after the program operation is performed, a verify read operation is performed at a time point t2. The selected word line is stabilized until the verify read operation is started after the program operation is completed. Here, the stabilization corresponds to a state in which the program current applied to the selected memory cell is sufficiently discharged to the selected word line such that a desired bias may be applied to the selected word line, during the program operation. Therefore, when the verify read operation is performed, the ground voltage may be applied to the selected word line.

When a read complete signal is delayed and transferred by the operation complete signal transfer unit 169 after the verify read operation is performed, a program operation is performed at a time point t3. The selected word line is stabilized until the program operation is started after the read operation is completed. Here, the stabilization corresponds to a state in which a sensing current passed through the memory cell is sufficiently discharged to the selected word line such that a desired bias may be applied to the selected word line, during the verify read operation. Therefore, when the program operation is performed, the ground voltage may be applied to the selected word line.

Similarly, when a program complete signal is delayed and transferred by the operation complete signal transfer unit 169 after the program operation is performed, a verify read operation is performed at a time point t4. The selected word line is stabilized until the verify read operation is started after the program operation is completed. Here, the stabilization corresponds to a state in which a program current applied to the selected memory cell is sufficiently discharged to the selected word line such that a desired bias is applied to the selected word line, during the program operation. Therefore, the ground voltage may be applied to the selected word line when the read operation is performed.

Since a desired voltage, i.e., the ground voltage may be applied to the selected word line when each operation is started, the phase change memory device 100 may operate with stability.

Figure 9:
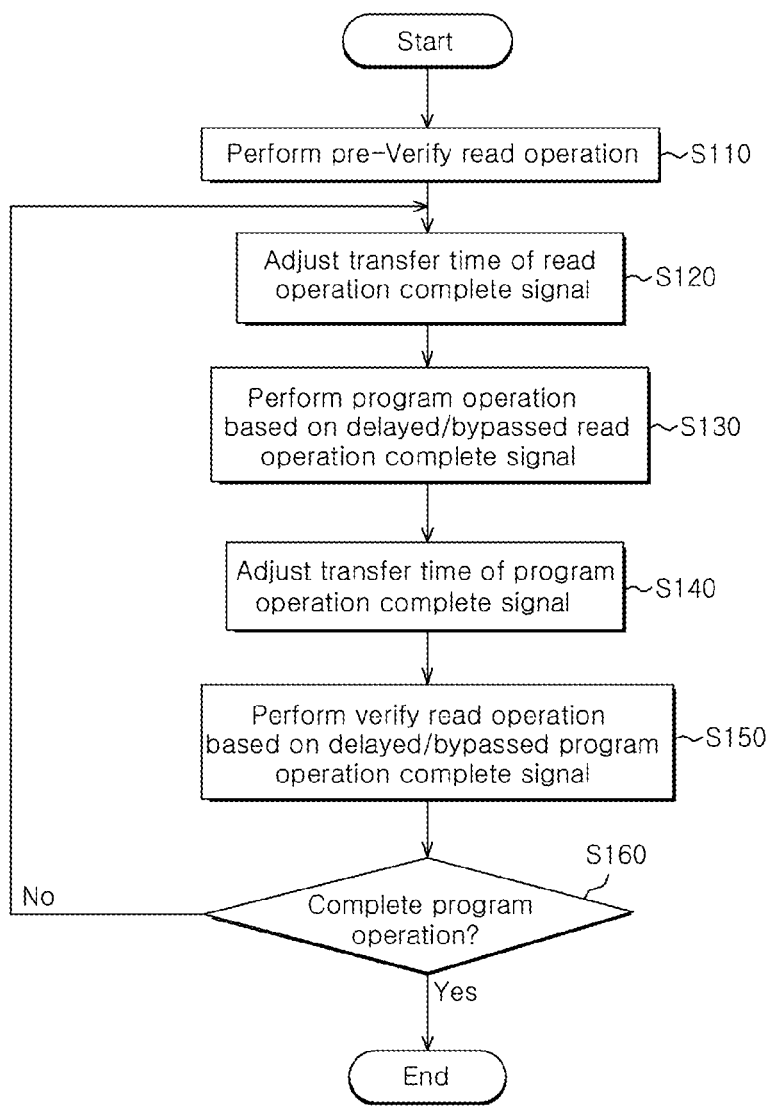
FIG. 9 is a flow chart showing the program operation of the phase change memory device according to an embodiment of the present invention.

FIG. 9 is a flow chart showing the program operation of the phase change memory device according to an embodiment of the present invention. Referring to FIGS. 2 and 9, the program operation of the phase change memory device according to an embodiment of the present invention will be described in detail.

At step S110, the read control logic 165 performs a pre-verify read operation. The read control logic 165 transfers a read complete signal to the operation complete signal transfer unit 169, when the pre-verify read operation is completed.

At step S120, the operation complete signal transfer unit 169 adjusts a transfer time of the read complete signal. That is, the operation complete signal transfer unit 169 delays or bypasses the read complete signal and then transfers the delayed or bypassed read complete signal to the program control logic 161. While the read complete signal is transferred to the program control logic 161 through the operation complete signal transfer unit 169, the voltage level of a selected word line may be stabilized.

At step S130, the program control logic 161 performs a program operation based on the delayed or bypassed read complete signal. The program control logic 161 transfers a program complete signal to the operation complete signal transfer unit 169 when the program operation is completed.

At step S140, the operation complete signal transfer unit 169 adjusts a transfer time of the program complete signal. That is, the operation complete signal transfer unit 169 delays or bypasses the program complete signal and then transfers the delayed or bypassed program complete signal to the read control logic 165. While the program complete signal is transferred to the read control logic 165 through the operation complete signal transfer unit 169, the voltage level of the selected word line may be stabilized.

At step S150, the read control logic 165 performs a verify read operation based on the delayed or bypassed program complete signal. At step S160, whether the program was completed or not is determined. When it is determined that the program was completed, the program operation is completed. However, when it is determined that the program was not completed, the procedure proceeds to the step S120. Then, the program loop is repetitively performed within a preset number until the selected memory cell is programmed.

Figure 10:
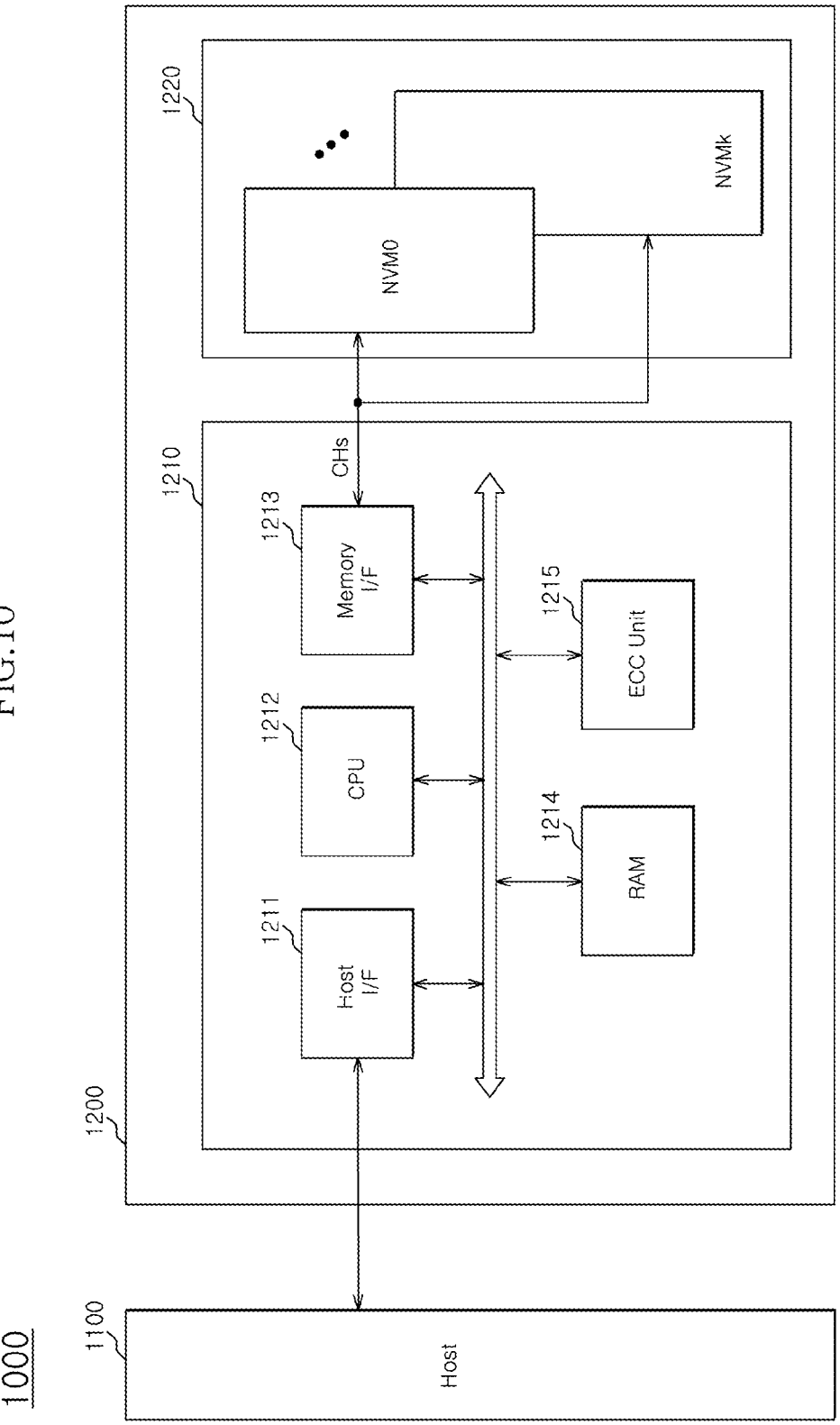
FIG. 10 is a block diagram illustrating a data processing system having the phase change memory device according to an embodiment of the present invention.

FIG. 10 is a block diagram illustrating a data processing system having the phase change memory device according to an embodiment of the present invention. Referring to FIG. 10, the data processing system 1000 includes a host 1100 and a data storage device 1200. The data storage device 1200 includes a controller 1210 and a data storage medium 1220. The data storage device 1200 may be coupled to the host 1100 such as a desktop computer, a notebook computer, a digital camera, a mobile phone, an MP3 player, a game machine or the like. The data storage device 1200 is also referred to as a memory system.

The controller 1210 is coupled to the host 1100 and the data storage medium 1220. The controller 1210 is configured to access the data storage medium 1220 in response to a request from the host 1100. For example, the controller 1210 is configured to control a read, program, or erase operation of the data storage medium 1220. The controller 1210 is configured to drive firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 is configured to control overall operations of the controller 1210 in response to a request of the host. The RAM 1214 may be used as a working memory of the CPU 1212. The RAM 1214 may temporarily store data read from the data storage medium 1220 or data provided from the host 1100.

The host interface 1211 is configured to interface the host 1100 and the controller 1210. For example, the host interface 1211 may be configured to communicate with the host 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 is configured to interface the controller 1210 and the data storage medium 1220. The memory interface 1213 is configured to provide a command and an address to the data storage medium 1220. Furthermore, the memory interface 1213 is configured to exchange data with the data storage medium 1220.

The data storage medium 1220 may be configured with the phase change memory device 100 of FIG. 2 according to an embodiment of the present invention. The data storage medium 1220 may include a plurality of phase change memory devices NVMO to NVMk. As the data storage medium 1220 is configured with the phase change memory device according to an embodiment of the present invention, a data storage error of the data storage device 1200 may be reduced.

The ECC unit 1215 is configured to detect an error of the data read from the data storage medium 1220. Furthermore, the ECC unit 1215 is configured to correct the detected error, when the detected error falls within a correction range. In addition, the ECC unit 1215 may be provided inside or outside the controller 1210 depending on the memory system 1000.

The controller 1210 and the data storage medium 1220 may be integrated to form a solid state drive (SSD).

As another example, the controller 1210 and the data storage medium 1220 may be integrated into one semiconductor device, thereby forming a memory card. For example, the controller 1210 and the data storage medium 1220 may be integrated into one semiconductor device, thereby forming a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted as various types of packages. For example, the controller 1210 or the data storage medium 1220 may be packaged and mounted according to various methods such as POP (package on package), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 11:
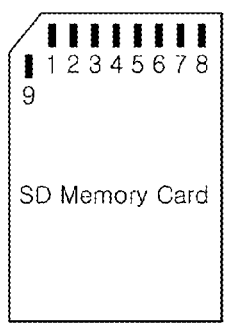
FIG. 11 illustrates a memory card including the phase change memory device according to an embodiment of the present invention.

FIG. 11 illustrates a memory card including the phase change memory device according to an embodiment of the present invention. FIG. 11 illustrates the exterior of an SD (secure digital) card among memory cards.

Referring to FIG. 11, the SD card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transferred. In general, the command is transmitted to the SD card from a host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, form a pair to transmit differential signals.

The SD card includes the phase change memory device 100 of FIG. 2 according to an embodiment of the present invention and a controller for controlling the phase change memory device. The controller included in the SD card may have the same configuration and function as the controller 1210 described with reference to FIG. 10.

Figure 12:
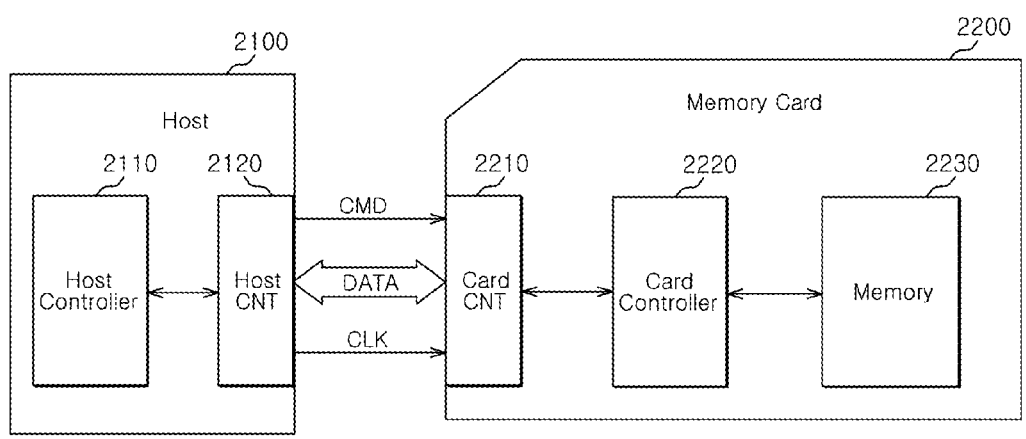
FIG. 12 is a block diagram illustrating the internal configuration of the memory card illustrated in FIG. 11 and the connection relation between the memory card and a host.

FIG. 12 is a block diagram illustrating the internal configuration of the memory card illustrated in FIG. 11 and the connection relation between the memory card and a host. Referring to FIG. 12, the data processing system 2000 includes a host 2100 and a memory card 2200. The host 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may differ depending on the type of the memory card 2200.

The host 2100 stores data in the memory card 2200 or reads data stored in the memory card 2200.

The host controller 2110 transmits a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 stores the received data DATA in the memory device 2230, using the clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 13:
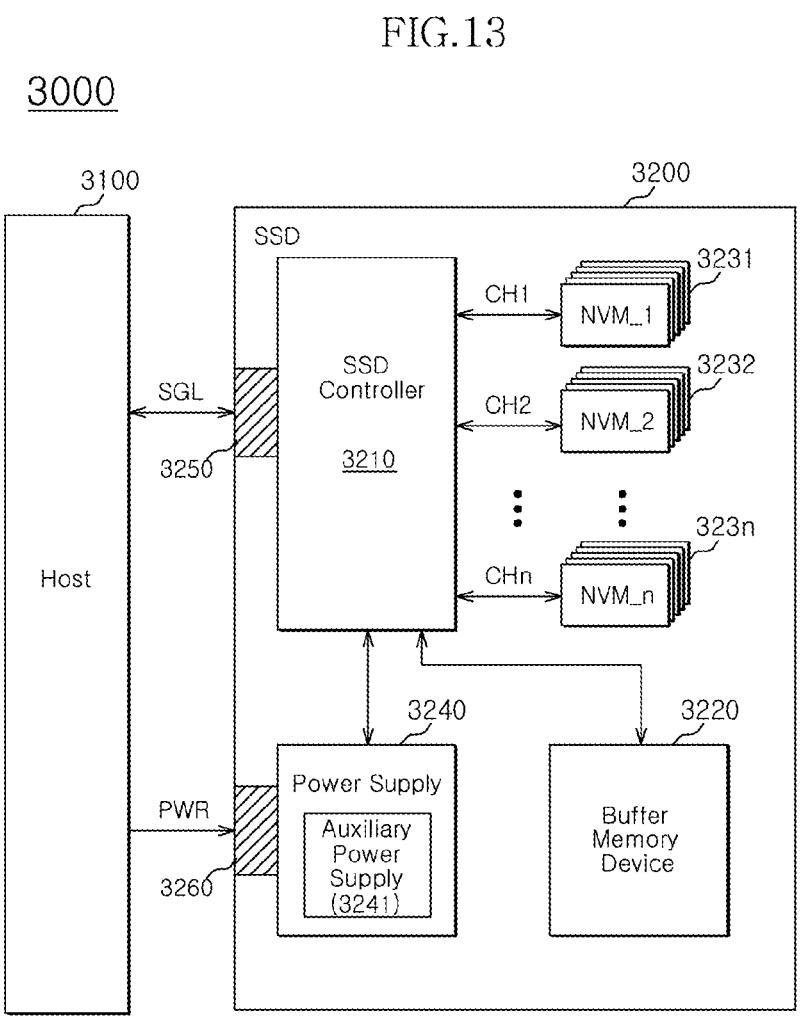
FIG. 13 is a block diagram illustrating a solid state drive (SSD) including the phase change memory device according to an embodiment of the present invention.

FIG. 13 is a block diagram illustrating an SSD including the phase change memory device according to an embodiment of the present invention. Referring to FIG. 13, a data processing system 3000 includes a host device 3100 and an SSD 3200.

The SSD 3200 includes an SSD controller 3210, a buffer memory device 3220, a plurality of phase change memory devices 3231 to 323n, a power supply 3240, a signal connector 3250, and a power connector 3260.

The SSD 3200 operates in response to a request of the host device 3100. That is, the SSD controller 3210 is configured to access the phase change memory devices 3231 to 323n in response to a request from the host 3100. For example, the SSD controller 3210 is configured to control read, program, and erase operations of the phase change memory devices 3231 to 323n.

The buffer memory device 3220 is configured to temporarily store data which are to be stored in the phase change memory devices 3231 to 323n. Furthermore, the buffer memory device 3220 is configured to temporarily store data read from the phase change memory devices 3231 to 323n. The data which are temporarily stored in the buffer memory device 3220 are transmitted to the host 3100 or the phase change memory devices 3231 to 323n, according to the control of the SSD controller 3210.

The phase change memory devices 3231 to 323n are used as storage media of the SSD 3200. Each of the phase change memory devices 3231 to 323n may be configured with the phase change memory device 100 of FIG. 2 according to an embodiment of the present invention. Therefore, data storage errors of the SSD 3200 may be reduced.

The respective phase change memory devices 3231 to 323n are coupled to the SSD controller 3210 through a plurality of channels CH1 to CHn. One channel may be coupled to one or more phase change memory devices. The phase change memory devices coupled to one channel may be coupled to the same signal bus and data bus.

The power supply 3240 is configured to provide power inputted through the power connector 3260 into the SSD 3200. The power supply 3240 includes an auxiliary power supply 3241. The auxiliary power supply 3241 is configured to supply power to normally terminate the SSD 3200, when sudden power off occurs. The auxiliary power supply 3241 may include super capacitors capable of storing power.

The SSD controller 3210 is configured to exchange signals SGL with the host 3100 through the signal connector 3250. Here, the signals SGL may include commands, addresses, data and the like. The signal connector 3250 may be configured with a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 14:
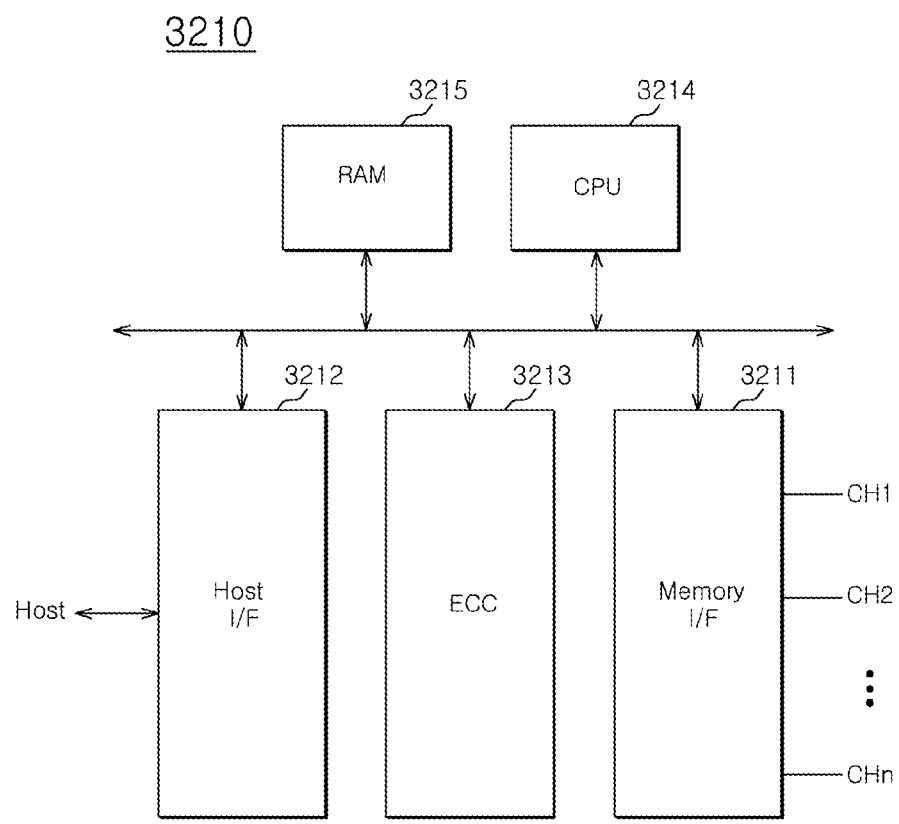
FIG. 14 is a block diagram illustrating a SSD controller illustrated in FIG. 13.

FIG. 14 is a block diagram illustrating the SSD controller illustrated in FIG. 13. Referring to FIG. 14, the SSD controller 3210 includes a memory interface 3211, a host interface 3212, an ECC unit, a CPU 3214, and a RAM 3215.

The memory interface 3211 is configured to provide a command and an address to the phase change memory devices 3231 to 323n. Furthermore, the memory interface 3211 is configured to exchange data with the phase change memory devices 3231 to 323n. The memory interface 3211 may scatter data transferred from the buffer memory device 3220 over the respective channels CH1 to CHn, according to the control of the CPU 3214. Furthermore, the memory interface 3211 transfers data read from the phase change memory devices 3231 to 323n to the buffer memory device 3220, according to the control of the CPU 3214.

The host interface 3212 is configured to provide an interface with the SSD 3200 in response to the protocol of the host 3100. For example, the host interface 3212 may be configured to communicate wit the host 3100 through one of PATA (Parallel Advanced Technology Attachment), SATA (Serial Advanced Technology Attachment), SCSI (Small Computer Small Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 is configured to generate parity bits based on the data transmitted to the phase change memory devices 3231 to 323n. The generated parity bits may be stored in spare areas of the phase change memory devices 3231 to 323n. The ECC unit 3213 is configured to detect an error of data read from the phase change memory devices 3231 to 323n. When the detected error falls within a correction range, the ECC unit 3213 may correct the detected error.

The CPU 3214 is configured to analyze and process a signal SGL inputted from the host 3100. The CPU 3214 controls overall operations of the SSD controller 3210 in response to a request of the host 3100. The CPU 3214 controls the operations of the buffer memory device 3220 and the phase change memory devices 3231 to 323n according to firmware for driving the SSD 3200. The RAM 3215 is used as a working memory device for driving the firmware.

Figure 15:
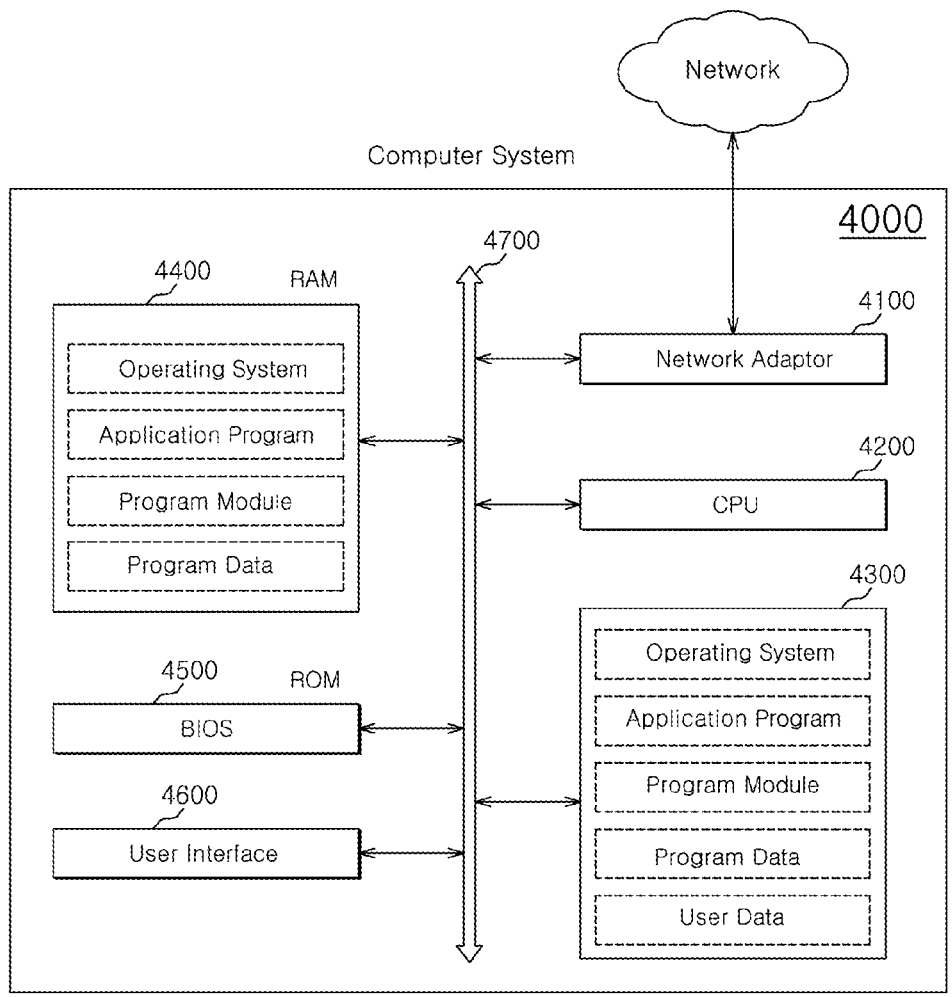
FIG. 15 is a block diagram illustrating a computer system in which a data storage device having the phase change memory device according to an embodiment of the present invention is mounted.

FIG. 15 is a block diagram illustrating a computer system in which a data storage device having the phase change memory device according to an embodiment of the present invention is mounted. Referring to FIG. 15, the computer system 4000 includes a network adapter 4100, a CPU 4200, a data storage device 4300, a RAM 4400, a ROM 4500, and a user interface 4600, which are electrically coupled to the system bus 4700. Here, the data storage device 4300 may be configured with the data storage device 1200 illustrated in FIG. 7 or the SSD 3200 illustrated in FIG. 10.

The network adapter 4100 is configured to provide an interface between the computer system 400 and external networks. The CPU 4200 is configured to perform overall arithmetic operations for driving an operating system or application programs staying in the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIS) and the like.

While certain embodiments have been described above, it will be understood to those skilled in the art that the embodiments described are by way of example only. Accordingly, the inventive devices and methods described herein should not be limited based on the described embodiments. Rather, the inventive devices and methods described herein should be defined in light of the claims that follow, when taken in conjunction with the above description and accompanying drawings.

What is claimed is:

1. A phase change memory device comprising:
   a memory cell arranged at a region where a word line and a bit line cross each other; and
   control logic comprising:
      program control logic configured to control a program operation of the memory cell;
      read control logic configured to control a read operation of the memory cell; and an operation complete signal transfer unit configured to adjust a first delay time of program complete signal transferred from the program control logic to the read control logic and a second delay time of a read complete signal transferred from the read control logic to the program control logic, wherein the program complete signal indicates that the program operation was completed and the read complete signal indicates that the read operation was completed.

2. The phase change memory device according to claim 1, wherein the operation complete signal transfer unit is configured to delay transfer of the program complete signal or the read complete signal until the word line is stabilized.

3. The phase change memory device according to claim 1, wherein the operation complete signal transfer unit is configured to increase or decrease the first delay time and the second delay time according to a transfer time control value.

4. The phase change memory device according to claim 1, wherein the program control logic provides the program complete signal to the operation complete signal transfer unit when a program operation for the memory cell is completed,
the operation complete signal transfer unit delays transfer of the provided program complete signal, and provides the delayed program complete signal to the read control logic, and
the read control logic performs a read operation for the memory cell in response to the provided program complete signal.

5. The phase change memory device according to claim 1, wherein the read control logic provides the read complete signal to the operation complete signal transfer unit when a read operation for the memory cell is completed,
the operation complete signal transfer unit delays transfer of the provided read complete signal, and provides the delayed read complete signal to the program control logic, and
the program control logic performs a program operation in response to the provided read complete signal.

6. The phase change memory device according to claim 1, wherein the operation complete signal transfer unit is configured to bypass the program complete signal or the read complete signal and then transfer the bypassed program complete signal or the bypassed read complete signal.

7. The phase change memory device according to claim 1, wherein the memory cell comprises:
a memory element having one end coupled to the bit line and formed of a phase change material; and
a selecting element configured to select the memory element.

8. The phase change memory device according to claim 7, wherein the selecting element comprises a diode coupled between the other end of the memory element and the word line.

9. An operation method of a phase change memory device, comprising the steps of:
applying a program current to a selected memory cell;
delaying transfer of a program complete signal after the step of applying the program current, wherein the program complete signal indicates that a program operation is completed; and
verifying a program state of the selected memory cell in response to the delayed program complete signal after the step of delaying transfer of the program complete signal.

10. The operation method according to claim 9, further comprising the step of delaying transfer of a first read complete signal indicating that the step of verifying the program state of the selected memory cell was performed,
wherein the step of applying the program current is performed in response to the delayed first read complete signal.

11. The operation method according to claim 10, wherein the step of applying the program current, the step of delaying the transfer of the program complete signal, the step of verifying the program state of the selected memory cell, and the step of delaying the transfer of the first read complete signal form one program loop, and
the program loop is repeated to program the selected memory cell.

12. The operation method according to claim 11, further comprising the steps of:
pre-verifying the program state of the selected memory cell; and
delaying transfer of a second read complete signal indicating that the step of pre-verifying the program state of the selected memory cell was performed,
wherein the step of applying the program current is performed in response to the delayed second read complete signal.

13. A data storage device comprising:
a phase change memory device; and
a controller configured to the control the phase change memory device,
wherein the phase change memory device comprises:
a memory cell arranged at a region where a word line and a bit line cross each other; and
a control logic comprising: program control logic configured to control a program operation of the memory cell; read control logic configured to control a read operation of the memory cell; and an operation complete signal transfer unit configured to adjust a first delay time of a program complete signal transferred from the program control logic to the read control logic and a second delay time of a read complete signal transferred from the read control logic to the program control logic.

14. The data storage device according to claim 13, wherein the operation complete signal transfer unit is configured to delay transfer of the program complete signal or the read complete signal until the word line is stabilized.

15. The data storage device according to claim 13, wherein the program control logic provides the program complete signal to the operation complete signal transfer unit when a program operation for the memory cell is completed,
the operation complete signal transfer unit delays transfer of the provided program complete signal, and provides the delayed program complete signal to the read control logic, and
the read control logic performs a read operation for the memory cell in response to the provided program complete signal.

16. The data storage device according to claim 13, wherein the read control logic provides the read complete signal to the operation complete signal transfer unit when a read operation for the memory cell is completed,
the operation complete signal transfer unit delays transfer of the provided read complete signal, and provides the delayed read complete signal to the program control logic, and
the program control logic performs a program operation in response to the provided read complete signal.

17. The data storage device according to claim 13, wherein the memory cell comprises:

a memory element having one end coupled to the bit line and formed of a phase change material; and a selecting element configured to select the memory element.

18. The data storage device according to claim 17, wherein the selecting element comprises a diode coupled between the other end of the memory element and the word line.

19. The data storage device according to claim 13, wherein the phase change memory device and the controller are configured as a memory card.

20. The data storage device according to claim 13, wherein the phase change memory device and the controller are configured as a solid date drive (SSD).

* * * * *